United States Patent
Lai et al.

(10) Patent No.: US 6,946,393 B2
(45) Date of Patent: Sep. 20, 2005

(54) SMALL GRAIN SIZE, CONFORMAL ALUMINUM INTERCONNECTS AND METHOD FOR THEIR FORMATION

(75) Inventors: Wing-Cheong Gilbert Lai, Boise, ID (US); Gurtej Singh Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 412 days.

(21) Appl. No.: 09/782,441

(22) Filed: Feb. 13, 2001

(65) Prior Publication Data

US 2001/0009807 A1 Jul. 26, 2001

Related U.S. Application Data

(62) Division of application No. 09/146,509, filed on Sep. 3, 1998, now Pat. No. 6,187,673.

(51) Int. Cl.$^7$ ..................... H01L 21/4763; H01L 21/44
(52) U.S. Cl. ..................... 438/648; 438/656; 438/680; 438/681
(58) Field of Search ................. 438/648, 653, 438/656, 680, 681, 683, 688

(56) References Cited

U.S. PATENT DOCUMENTS

| | | | |
|---|---|---|---|
| 4,999,160 A | 3/1991 | Lowrey et al. | 420/529 |
| 5,108,951 A * | 4/1992 | Chen et al. | 438/643 |
| 5,192,589 A | 3/1993 | Sandhu | 427/255.1 |
| 5,246,881 A | 9/1993 | Sandhu et al. | 437/192 |
| 5,288,665 A * | 2/1994 | Nulman | 438/672 |
| 5,316,972 A | 5/1994 | Mikoshiba et al. | 437/187 |
| 5,328,873 A | 7/1994 | Mikoshiba et al. | 437/187 |
| 5,383,970 A | 1/1995 | Asaba et al. | 118/726 |
| 5,384,284 A | 1/1995 | Doan et al. | 437/190 |
| 5,420,072 A | 5/1995 | Fiordalice et al. | 437/192 |
| 5,480,684 A | 1/1996 | Sandhu | 427/531 |
| 5,552,181 A | 9/1996 | Kondoh et al. | 427/248.1 |
| 5,654,235 A | 8/1997 | Matsumoto et al. | 438/643 |
| 5,700,718 A | 12/1997 | McTeer | 437/192 |
| 5,726,100 A | 3/1998 | Givens | 438/702 |
| 5,844,318 A | 12/1998 | Sandhu et al. | 257/774 |
| 5,847,463 A | 12/1998 | Trivedi et al. | 257/751 |
| 5,861,344 A | 1/1999 | Roberts et al. | 438/738 |
| 5,866,205 A | 2/1999 | Vaartstra et al. | 427/255.1 |
| 5,972,179 A | 10/1999 | Chittipeddi et al. | 204/192.17 |
| 6,077,571 A | 6/2000 | Kaloyeros et al. | 427/576 |
| 6,271,137 B1 | 8/2001 | Liou et al. | 438/688 |

OTHER PUBLICATIONS

Fiordalice, R.W., et al., "Orientation Control of Chemical Vapor Deposition TiN Film for Barrier Applications", *Journal of the Electrochemical Society, 143*(6), pp. 2059–2063, (Jun. 1996).

Lee, H., et al., "Study of Diffusion Barrier Perfomance in MOCVD TiN by Transmission Electron Microscopy", *Materials Research Society Symposium Proceedings, 391*, pp. 205–209, (1995).

Pramanik, D., et al., "Effect of Underlayer on Sputtered Aluminum Grain Structure and its Correlation with Step Coverage in Submicron Vias", *1990 Proceedings Seventh International IEEE VLSI Multilevel Interconnection Conference*, IEEE Catolog No. 90TH0325–1, pp. 332–334, (Jun. 1990).

* cited by examiner

*Primary Examiner*—T. N. Quach
(74) *Attorney, Agent, or Firm*—Schwegman, Lundberg, Woessner & Kluth, P.A.

(57) ABSTRACT

A first layer of titanium nitride (TiN) is formed on a semiconductor structure, such as an interconnect via. Then, a second layer of TiN is formed on the first layer of TiN. The first layer of TiN is amorphous. The second layer of TiN is polycrystalline, having a mixed grain orientation. Finally, an aluminum film is formed on the second layer of titanium nitride. Optionally, a titanium silicide layer is formed on the semiconductor structure prior to the step of forming the first layer of titanium nitride. Interconnects formed according to the invention have polycrystalline aluminum films with grain sizes of approximately less than 0.25 microns.

18 Claims, 3 Drawing Sheets

SMALL GRAIN SIZE, CONFORMAL ALUMINUM INTERCONNECTS AND METHOD FOR THEIR FORMATION

This application is a Divisional of U.S. application Ser. No. 09/146,509, filed Sep. 3, 1998 now U.S. Pat. No. 6,187,673.

FIELD OF THE INVENTION

The present invention relates generally to semiconductor integrated circuits and methods for their fabrication and, more particularly, to aluminum interconnects and methods for their formation.

BACKGROUND

Semiconductor integrated circuits (ICs) contain individual devices, which are typically operatively-coupled together using metal lines. In most applications, the metal lines are formed on a different level than the devices, separated by an intermediate dielectric, such as silicon oxide or borophosphosilicate glass (BPSG). The most commonly used metal lines are aluminum. Interconnects are formed between individual devices and the metal lines. A typical interconnect between metal layers is composed of a via (i.e. opening) formed in an intermediate dielectric. Similarly, an interconnect between a metal layer and silicon is composed of a contact (i.e. opening) formed in an intermediate dielectric over an active device region. The via is filled with a metal, such as aluminum or tungsten. Aluminum has been preferred to date as an interconnect metal. Aluminum exhibits relatively low resistivity as compared to tungsten and, furthermore, is highly compatible with silicon oxide, which is often used as the insulative material surrounding a via. Furthermore, when metal lines are used, which are composed of aluminum, compatibility between the metal lines and the aluminum interconnect materials is optimized.

Interconnects often further contain a diffusion barrier layer sandwiched between the metal and the active device region at the bottom of the via. Such layers prevent intermixing of the metal and material from the active device region, such as silicon, which extends the life of the device. Passive titanium nitride diffusion barrier layers are the most common diffusion barrier layers. Such layers are typically formed over a refractory metal silicide layer. Titanium silicide is the most commonly used refractory metal silicide due to its relatively low resistivity. The use of titanium silicide between titanium nitride and the active device region is preferred due to its intermediate crystallographic characteristics between those of silicon and titanium nitride. The intermediate crystallographic characteristics prevent increased resistivity resulting from a contact solely between silicon and titanium nitride, whose crystallographic characteristics are very different.

Ideally, interconnects exhibit zero impedance to current flow, as exhibited in an ohmic contact (i.e. those which exhibit linear current vs. voltage characteristics), to provide optimum electrical performance. However, interconnects are not ideal and typically exhibit near linear characteristics at best.

One significant concern in depositing metal into a via is obtaining adequate step coverage of the via, particularly obtaining adequate step coverage is difficult when the vias have high aspect ratios (i.e. a large ratio of height to width of the via), as seen more often as IC densities increase. To mitigate this problem, chemical vapor deposition (CVD) is used to deposit the metal instead of physical vapor deposition (PVD). CVD is more apt to adequately fill high-aspect ratio contact holes than PVD. However, to date, CVD aluminum exhibits rough, nonconformal layers on complex topographies, prior to surface modification. This is undesirable because voids often develop within a via, due to the roughness of the CVD aluminum. Such voids severely increase the resistivity of a contact and degrade device performance by not providing uniform connection across an interconnect.

There is a need for an interconnect structure that effectively utilizes aluminum instead of tungsten. There is a further need for a method for forming a smooth, conformal aluminum layer within an interconnect structure. A method for using aluminum in sub-0.25 micron contact holes is needed in order to optimize future device performance.

SUMMARY OF THE INVENTION

The present invention provides a method and apparatus for fabricating an interconnect supported by a semiconductor structure. A first layer of titanium nitride is formed on the semiconductor structure. Then, a second layer of titanium nitride is formed on the first layer of titanium nitride. Finally, an aluminum film is formed on the second layer of titanium nitride. A titanium silicide layer is optionally formed on the semiconductor structure prior to the step of forming the first layer of titanium nitride.

In particular, according to one aspect of the method of the present invention, a first titanium nitride layer is formed on an active device region to act as a barrier layer, protecting the integrity of the contact. To accomplish this task, an amorphous titanium nitride layer is formed by reacting a titanium-containing precursor in the presence of nitrogen. Then, a second titanium nitride layer is formed on the first titanium nitride layer. The second titanium layer has a polycrystalline orientation (having a mixture of grains orientated in the <111> and <200> directions), which allows diffusion between the active device region and the interconnect metal. By forming a polycrystalline layer over the amorphous barrier layer, subsequent formation of small grain size chemical vapor deposition (CVD) aluminum is possible. The second titanium nitride layer is formed by reacting a titanium-containing precursor in the presence of at least ammonia ($NH_3$) or nitrogen trifluoride ($NF_3$). The titanium-containing precursors for forming the first and second layers of TiN are selected from the group consisting of: titanium tetrachloride, tetrakisdimethylamide titanium, and trimethylethylenediamino titanium. Finally, CVD aluminum is formed on the second titanium nitride layer to complete the interconnect. To form the CVD aluminum, an aluminum-containing precursor is used. The aluminum-containing precursor is selected from the group consisting of: trimethylaluminum (TMA), dimethylaluminum hydride (DMAH), triisobutylaluminum (TIBA), triethylaluminum (TEA), diethylaluminum hydride (DEAH), monomethylaluminum hydride (MMAH), dimethylethylalane (DMEHA1), and dimethylethylamide (DMEHA2).

In particular, according to another aspect of the method of the present invention, a titanium silicide layer is formed between the first titanium nitride layer and the underlying active device region to further improve the ohmic characteristics of the contact. Titanium silicide has an intermediate crystallographic structure between that of silicon in the active device region and titanium nitride. Thus, electronic carriers are able to diffuse easily through the interconnect structure.

The crystal structure and grain size of the underlayers are controlled to promote subsequent formation of a small grain size, conformal aluminum film in an interconnect. The aluminum film formed according to the method of the invention has a polycrystalline orientation, with grain sizes of less than approximately 0.25 microns. Thus, interconnects are formed with aluminum instead of tungsten, providing a lower resistivity contact to adjacent active device regions. Furthermore, such aluminum films are more conformal due to their smaller grain sizes. Vias are thus able to be filled with such aluminum to provide an interconnect structure substantially free of unwanted voids.

DESCRIPTION OF THE INVENTION

Figure 1:
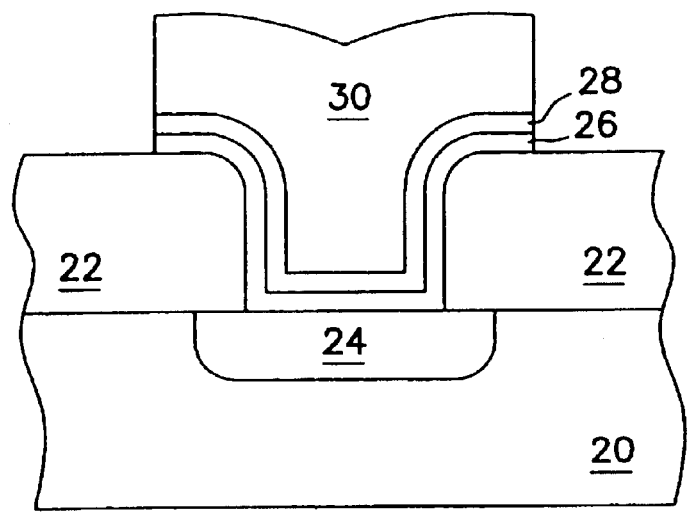
FIG. 1 is a cross-sectional representation of an aluminum interconnect formed in accordance with the method of the invention.

In the following detailed description of the preferred embodiments, reference is made to the accompanying drawings which form a part hereof, and in which is illustrated by way of specific embodiments in which the invention may be practiced. It is to be understood that other embodiments may be utilized and that structural or logical changes may be made without departing from the scope of the present invention. For example, the terms wafer and substrate used in the following description include any semiconductor-based structure. Wafer and substrate are used interchangeably to refer to supporting semiconductor structures 20 during processing, as illustrated in FIGS. 1 to 4. Both are to be understood as including silicon-on-sapphire (SOS) technology, silicon-on-insulator (SOI) technology, doped and undoped semiconductors, epitaxial layers of a silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure 20. The following detailed description is, therefore, not to be taken in a limiting sense, and the scope of the present invention is defined by the appended claims.

The following described embodiments of the present invention are described as applied to forming a small grain size, conformal aluminum film in a via or contact, referred to herein as an interconnect via, in an integrated circuit (IC). However, the claims are not meant to be read as limited to forming such an aluminum film only in IC interconnect vias. The invention is particularly useful for forming aluminum films in sub-0.25 micron interconnect vias (contact holes) and interconnect vias having high-aspect ratios (i.e., ratio of height to diameter of an interconnect via), such as those greater than approximately 5:1. In particular, source/drain active regions of metal-oxide-semiconductor (MOS) transistors have a particularly high aspect ratio of approximately 8:1. Previously, conformal aluminum films were difficult to form in such structures. By using the method of the invention, lower resistivity aluminum is able to be used in interconnect vias, instead of tungsten, providing better IC performance. This is particularly critical in sub-0.25 micron technology applications.

Interconnect structures illustrated in FIGS. 1 to 4 are formed according to the method of the invention. In the following example, an interconnect is etched in an isolating material 22, such as silicon oxide or borophosphosilicate glass (BPSG) to define a semiconductor structure having a bottom surface, a top surface, and sidewalls of an interconnect via. The bottom surface of the interconnect via is an active region 24 of an IC, such as a source/drain region in a transistor. The top surface and sidewalls of the interconnect via comprise the isolating material 22 in which the interconnect via is etched.

The semiconductor structure is then placed in a chemical vapor deposition (CVD) reaction chamber. A titanium-containing organometallic precursor, such as tetrakisdimethylamido titanium (TDMAT) or trimethylethylenediamino titanium (TMEDT), or another titanium-containing precursor gas, such as titanium tetrachloride is reacted in the CVD chamber. The main criteria for selecting a titanium-containing precursor gas is to assure that the precursor gas is capable of reacting in a CVD chamber to form a titanium nitride (TiN) film.

A first layer of TiN 26 is formed on the semiconductor structure, extending into the interconnect via, by reacting the titanium-containing precursor with nitrogen gas. The titanium-containing precursor is flowed at approximately 10 to 100 sccm. Nitrogen is flowed at approximately 10 to 1,000 sccm. Pressure in the CVD chamber is maintained at approximately 0.1 to 760 Torr. Temperature in the CVD chamber is maintained at approximately below the respective decomposition temperature for the precursor, but at a temperature that permits the precursor to be sufficiently capable of being volatilized in the CVD chamber. This method is applicable to any suitable type of CVD chamber, including cold-wall and hot-wall chambers. Consequently, temperature is also adjusted according to the type of CVD chamber used. These pressures and temperatures do not, however, appear to be highly critical to the deposition of the TiN layer 26.

By using the method described for forming the first layer of TiN 26, the resulting TiN film 26 is amorphous, preventing unwanted diffusion between the active device region 24 and the subsequently formed aluminum 30. The thickness of the first layer of TiN 26 is proportionate to the dimensions of the interconnect via. For example, for a 0.25 micron interconnect via, the thickness is approximately 100 to 200 angstroms.

A second layer of TiN 28 is then formed on the first layer of TiN 26 by reacting a titanium-containing precursor as described above with at least one of the following gases: ammonia and nitrogen trifluoride. The titanium-containing precursor is flowed at approximately 10 to 100 sccm. Ammonia or nitrogen trifluoride is flowed at approximately 10 to 1,000 sccm. Optionally, other gases, such as inert carrier gases or nitrogen, can be used in the CVD chamber during reaction to form the second layer of TiN 28. Such optional gases are flowed at approximately 10 to 1,000 sccm. Pressure in the CVD chamber is maintained at approximately 0.1 to 760 Torr. Temperature in the CVD chamber is maintained at approximately below the respective decomposition temperature for the precursor, but at a temperature such that the precursor is sufficiently capable of being volatilized in the CVD chamber. This method is applicable using any suitable type of CVD chamber, including cold-wall and hot-wall chambers. Thus, temperature is also adjusted according to the type of CVD chamber used. Again, as in the deposition of TiN layer 26, pressures and temperatures do not appear to be highly critical to the deposition of the TiN layer 28.

By using the method described for forming the second layer of TiN 28, the resulting TiN film 28 has a polycrystalline orientation. In particular, the grain orientation of the second layer of TiN 28 comprises a mixture 1:1 of <111> and <200> orientated grains. It is preferred that this layer of TiN have a polycrystalline orientation, so that the subsequently formed aluminum 30 will have a small grain size and conformal shape due to the abundance of grain nucleation sites at boundaries between adjacent grains in the second TiN layer 28. Such a plurality of nucleation sites enables small grains to form in the subsequently formed aluminum 30. When there are many nucleation sites present, grains will nucleate and impinge on each other, preventing any of the grains from easily growing too big. The thickness of the second layer of TiN 28 is proportionate to the dimensions of the interconnect via. For example, for a 0.25 micron interconnect via, the thickness is approximately 100 to 200 angstroms.

An aluminum-containing organometallic precursor, such as trimethylaluminum (TMA), dimethylaluminum hydride (DMAH), triisobutylaluminum (TIBA), triethylaluminum (TEA), diethylaluminum hydride (DEAH), monomethylaluminum hydride (MMAH), dimethylethylaminealane (DMEAA), or dimethylethylamide (DMEHA) is reacted in the CVD chamber in the presence of a carrier gas, such as inert gases to form the aluminum interconnect 30. The thickness of the aluminum 30 is proportionate to the dimensions of the interconnect via. For example, for a 0.25 micron interconnect via, the thickness of the aluminum 30 within the interconnect via is approximately 2,000 to 3,000 angstroms. However, more aluminum 30 is also deposited outside of the interconnect via. For example, for a 0.25 micron interconnect via, approximately 1,000 to 2,000 angstroms of aluminum is also deposited above the top surface of the interconnect via. Then, excess TiN 26, 28 and aluminum 30 is removed to form an interconnect structure as well known to one skilled in the art and illustrated in FIG. 1. The presence of multiple, small grains in the aluminum 30 enable the aluminum 30 to conform more easily to surfaces having complex topographies, such as high-aspect ratio interconnect vias. Improved conformality in aluminum interconnect 30 prevents formation of voids within the interconnect.

Figure 2:
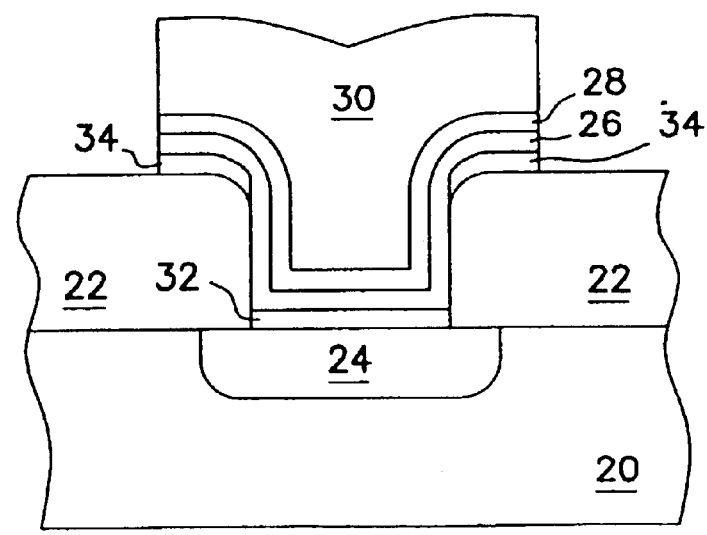
FIG. 2 is a cross-sectional representation of an embodiment wherein a titanium silicide layer is formed between an active device region and the interconnect.

In another embodiment, a refractory metal silicide layer 32 is formed on the bottom surface of the interconnect via prior to formation of the first or second TiN layers 26 and 28 and the aluminum 30, as illustrated in FIG. 2. The presence of a refractory metal silicide layer 32 between the active region 24 and the TiN diffusion barrier layer 26 decreases resistivity of the contact by providing a layer of material 32 having an intermediate grain structure between that of silicon in the active region 24 and titanium in the TiN layer 26.

To form the refractory metal silicide layer 32, a refractory metal 34, such as titanium, is deposited over the semiconductor structure, extending into the interconnect via to a thickness proportional to the dimensions of the interconnect via. For example, for a 0.25 micron interconnect via, the thickness is approximately 100 to 200 angstroms. The structure is then annealed to form the refractory metal silicide 32, such as titanium silicide, on those surfaces containing silicon, that support the titanium layer 34. Typically, the active region 24 over which an interconnect is formed contains silicon. Therefore, titanium silicide 32 forms only on the bottom surface of a interconnect via overlying an active region 24. The remaining titanium 34 remains unreacted on the semiconductor structure.

Figure 3:
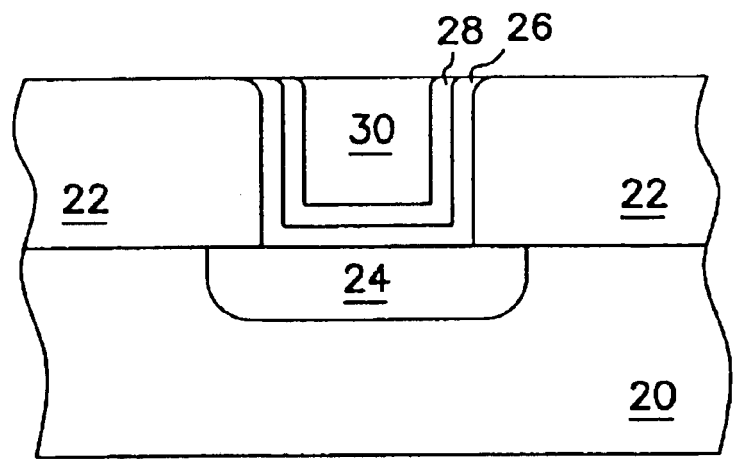
FIG. 3 is a cross-sectional representation of an embodiment wherein a damascene aluminum interconnect is formed using the method of the invention.
Figure 4:
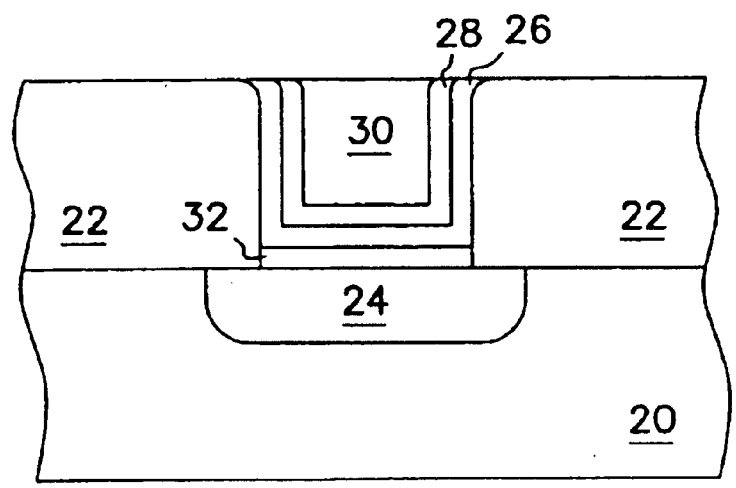
FIG. 4 is a cross-sectional representation of an embodiment wherein a damascene aluminum interconnect is formed over a titanium silicide layer using the method of the invention.

In yet another embodiment, the final interconnect structures illustrated in FIGS. 1 and 2 are polished so that the top surface of the final interconnect is coplanar with the top surface of the interconnect via, as illustrated in FIGS. 3 and 4. Any type of polishing technique is used to form the damascene structures illustrated in FIGS. 3 and 4. Typically, chemical mechanical polishing is used to polish the structure, as well known to one skilled in the art. FIG. 4 illustrates one embodiment of the invention, in which a refractory metal silicide layer 32 is also formed in the damascene interconnect. The resulting damascene structures utilize the aluminum 30 within the interconnect via as both an interconnect metal and metal line structures, which connect adjacent devices in an IC. By using a damascene structure, the need for subsequently forming metal lines on the interconnect structure for connecting adjacent active devices is eliminated.

Figure 5:
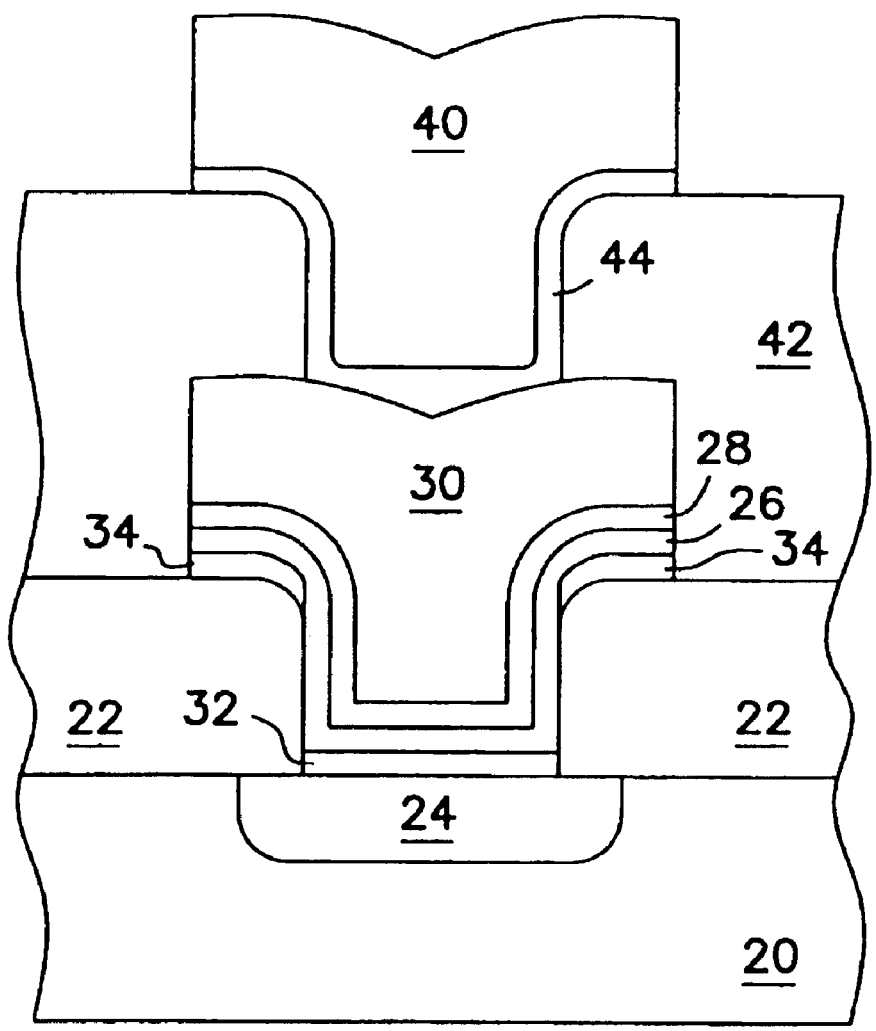
FIG. 5 is a cross-sectional representation of a multi-level interconnect structure.

FIG. 5 illustrates a second interconnect connection formed between the first metal layer 30 and a second metal layer 40. These layers can be aluminum which is connected as described above using an interconnect via extending through an intermediate layer(s) of oxide 42. A layer of TiN 44 is provided as described above for layer 28. Thus, multiple levels of interconnects (both contacts and vias) can be formed using the described methods.

The invention was described above with reference to forming low resistivity interconnects in an IC. However, the method utilized for forming the small grain size, conformal aluminum films 30 is applicable to forming aluminum films anywhere as desired over a supporting semiconductor structure. Resulting aluminum films 30 have a lower resistivity than other types of metal films currently used, such as tungsten, and have a conformal shape due to the small grain size in the aluminum 30. Thus, such films 30 are able to be easily formed over complex topographies. In particular, when filling an interconnect via with the aluminum 30, voids are prevented from forming within the interconnect via. Unwanted voids degrade device performance, often causing shorts in the circuit.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of fabricating an interconnect supported by a semiconductor structure in a chemical vapor deposition reaction chamber, comprising:

flowing a first titanium-containing precursor in the chemical vapor deposition reaction chamber;

flowing nitrogen in the chemical vapor deposition reaction chamber simultaneously with flowing the titanium-containing precursor to form a first layer of titanium nitride on the semiconductor structure;

flowing a second titanium-containing precursor in the chemical vapor deposition reaction chamber;

flowing at least one gas selected from the group consisting of ammonia and nitrogen trifluoride in the chemical vapor deposition reaction chamber simultaneously with the step of flowing the second titanium-containing precursor to form a second layer of titanium nitride on the first layer of titanium nitride wherein the second layer of titanium nitride comprises a polycrystalline orientation that comprises a mixture of 1:1 of <111> and <200> oriented grains; and flowing an aluminum-containing precursor in the chemical vapor deposition reaction chamber to form an aluminum film of small grain size on the second layer of titanium nitride.

2. The method of claim 1, further comprising the step of forming a titanium silicide layer on the semiconductor structure prior to the step of flowing the first titanium-containing precursor.

3. The method of claim 1, wherein the first and second titanium-containing precursors are selected from the group consisting of: titanium tetrachloride, tetrakisdimethylamido titanium and trimethylethylenediamino titanium.

4. The method of claim 1, wherein the aluminum-containing precursor is selected from the group consisting of: trimethylaluminum (TMA), dimethylaluminum hydride (DMAH), triisobutylaluminum (TIBA), triethylaluminum (TEA), diethylaluminum hydride (DEAH), monomethylaluminum hydride (MMAH), dimethylethylalane (DMEHA1), and dimethylethylamide (DMEHA2).

5. A method of fabricating an interconnect supported by a semiconductor structure in a chemical vapor deposition reaction chamber, comprising:

flowing a first titanium-containing precursor in the chemical vapor deposition reaction chamber;

flowing nitrogen in the chemical vapor deposition reaction chamber simultaneously and flowing the titanium-containing precursor to form a first layer of titanium nitride on the semiconductor structure;

flowing a second titanium-containing precursor in the chemical vapor deposition reaction chamber;

flowing at least one gas selected from the group consisting of ammonia and nitrogen trifluoride in the chemical vapor deposition reaction chamber simultaneously with flowing the second titanium-containing precursor to form a second layer of titanium nitride on the first layer of titanium nitride wherein the second layer of titanium nitride comprises a polycrystalline orientation that comprises a mixture of 1:1 of <111> and <200> oriented grains; and flowing an aluminum-containing precursor in the chemical vapor deposition reaction chamber to form an aluminum film having a small grain size on the second layer of the titanium nitride.

6. The method of claim 5 wherein the aluminum film has a grain size of approximately 0.25 microns.

7. The method of claim 5 wherein the aluminum film has a grain size of less than 0.25 microns.

8. The method of claim 5 wherein the aluminum film grains have a polycrystalline orientation.

9. The method of claim 5, further comprising forming a titanium silicide layer on the semiconductor structure prior to flowing the first titanium-containing precursor.

10. The method of claim 5, wherein the first and second titanium-containing precursors are selected from the group consisting of: titanium tetrachloride, tetrakisdimethylamido titanium and trimethylethylenediamino titanium.

11. The method of claim 5, wherein the aluminum-containing precursor is selected from the group consisting of: trimethylaluminum (TMA), dimethylaluminum hydride (DMAH), triisobutylaluminum (TIBA), triethylaluminum (TEA), diethylaluminum hydride (DEAH), monomethylaluminum hydride (MMAH), dimethylethylalane (DMEHA1) and dimethylethylamide (DMEHA2).

12. A method for forming a transistor with an interconnect via, defined by a surface substantially free of voids, comprising:

etching an interconnect into silicon oxide or borophosphosilicate glass to define a semiconductor structure defining an interconnect via comprising an active, region of a transistor;

exposing the semiconductor structure to a titanium-containing precursor gas flow at a rate of 10 to 100 sccm and nitrogen gas at a flowrate of 10 to 1000 sccm and forming a titanium nitride film on the semiconductor structure;

exposing the semiconductor structure with the titanium nitride film to a titanium-containing precursor gas and to ammonia or nitrogen trifluoride gas at a flowrate of 10 to 1000 sccm and forming a second titanium nitride film having a polycrystalline orientation wherein the second layer of titanium nitride comprises a polycrystalline orientation that comprises a mixture of 1:1 of <111> and <200> oriented grains; and exposing the semiconductor structure with the second titanium nitride film having a polycrystalline orientation to an aluminum-containing organometallic precursor to form an aluminum interconnect wherein the aluminum has a small grain size.

13. The method of claim 12 wherein the via formed has a high aspect ratio.

14. The method of claim 13 wherein the aspect ratio that is greater than about 5:1.

15. The method of claim 13 wherein the aspect ratio is about 8:1.

16. The method of claim 13 wherein the thickness of the titanium nitride film is about 100 to 200 angstroms for a 0.25 micron interconnect via.

17. The method of claim 12 wherein the aluminum-containing organometallic precursor is selected from the group consisting of trimethylaluminum, dimethylaluminum hydride, triisobutylaluminum, triethylaluminum, diethylaluminum hydride, monomethylaluminum hydride, dimethylethylaminealane, and dimethylethylethylamide.

18. The method of claim 12 wherein the thickness of the aluminum is about 2000 to 3000 angstroms.

* * * * *

UNITED STATES PATENT AND TRADEMARK OFFICE
CERTIFICATE OF CORRECTION

PATENT NO. : 6,946,393 B2 Page 1 of 1
DATED : September 20, 2005
INVENTOR(S) : Lai et al.

It is certified that error appears in the above-identified patent and that said Letters Patent is hereby corrected as shown below:

Title page,
Item [56], References Cited, U.S. PATENT DOCUMENTS, below
"5,420,072    5/1995    Fiordalice et al. 437/192" insert
-- 5,464,666   11/1995   Fine et al. 427/576 --.

Column 8,
Line 20, after "active" delete ",".
Line 55, delete "dimethylethylethylamide" and insert
-- dimethylethylamide --.

Signed and Sealed this

Fourteenth Day of March, 2006

JON W. DUDAS
*Director of the United States Patent and Trademark Office*